(12) United States Patent
Hong (10) Patent No.: US 10,879,884 B2
(45) Date of Patent: Dec. 29, 2020

(54) BUFFER CIRCUIT OF A SEMICONDUCTOR APPARATUS (71) Applicant: SK hynix Inc., Icheon-si (KR)

(72) Inventor: Gi Moon Hong, Seoul (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 16/557,387

(22) Filed: Aug. 30, 2019

(65) Prior Publication Data

US 2020/0204169 A1 Jun. 25, 2020

(30) Foreign Application Priority Data

Dec. 24, 2018 (KR) ........................ 10-2018-0168413

(51) Int. Cl.
*H03K 5/156* (2006.01)
*H03K 19/20* (2006.01)

(52) U.S. Cl.
CPC ........... *H03K 5/1565* (2013.01); *H03K 19/20* (2013.01)

(58) Field of Classification Search
CPC ................. H03K 5/1565; H03K 19/20; H03K 19/018528; H04L 25/0294

USPC ......................................... 327/201, 208, 291
See application file for complete search history.

(56) References Cited

U.S. PATENT DOCUMENTS

| | | | | |
|---|---|---|---|---|
| 6,636,098 B1 * | 10/2003 | Kizer | ................. | H03F 3/45192 327/333 |
| 8,339,159 B2 * | 12/2012 | Lee | ........................ | H03K 5/153 327/77 |
| 8,952,762 B2 | 2/2015 | O'Sullivan | | |

* cited by examiner

*Primary Examiner* — John W Poos
(74) *Attorney, Agent, or Firm* — William Park & Associates Ltd.

(57) ABSTRACT

A buffer circuit includes a current mode circuit configured to generate output signals by converting a current path depending on input signals and configured to correct a swing width of the output signals by adjusting a current amount depending on a level of a compensation signal. The buffer circuit also includes a compensation signal generation circuit configured to detect a swing width variation of the output signals and configured to generate the compensation signal for correcting a swing width of the output signals to conform to a target value, depending on a detected swing width.

18 Claims, 5 Drawing Sheets

BUFFER CIRCUIT OF A SEMICONDUCTOR APPARATUS

CROSS-REFERENCES TO RELATED APPLICATION

The present application claims priority under 35 U.S.C. § 119(a) to Korean application number 10-2018-0168413, filed on Dec. 24, 2018, in the Korean Intellectual Property Office, which is incorporated herein by reference in its entirety.

BACKGROUND

1. Technical Field

Various embodiments generally relate to a semiconductor apparatus, and, more particularly, to a buffer circuit of a semiconductor apparatus.

2. Related Art

A semiconductor apparatus uses a plurality of buffer circuits for inputting/outputting various signals, such as data and a clock signals.

In the operation of a buffer circuit, the swing width of an output signal changes under the influence of variation in operating environment, that is, a variation in PVT (process, voltage and temperature) or/and a variation in operation frequency.

In the case where the swing width of the output signal of a buffer circuit is smaller than a target value, a problem may occur in that a malfunction of a circuit which receives the output signal may be caused. In the case where the swing width of the output signal of the buffer circuit is larger than the target value, a problem may occur in that current consumption increases.

SUMMARY

Various embodiments of the present teachings are directed to a buffer circuit of a semiconductor apparatus capable of automatically and continuously correcting the swing width of an output signal.

In an embodiment, a buffer circuit may include a current mode circuit configured to generate output signals by converting a current path depending on input signals and configured to correct a swing width of the output signals by adjusting a current amount depending on a level of a compensation signal. The buffer circuit may also include a compensation signal generation circuit configured to detect a swing width variation of the output signals and configured to generate the compensation signal for correcting a swing width of the output signals to conform to a target value, depending on a detected swing width.

In an embodiment, a buffer circuit may include a first current mode circuit configured to generate first and second output signals by converting a current path depending on a first input signal and a second input signal among a plurality of input signals having different phases, and configured to correct a swing width of the first and second output signals by adjusting a first current amount depending on a level of a compensation signal. The buffer circuit may also include a second current mode circuit configured to generate third and fourth output signals by converting a current path depending on a third input signal and a fourth input signal among the plurality of input signals, and configured to correct a swing width of the third and fourth output signals by adjusting a second current amount depending on a level of the compensation signal. The buffer circuit may further include a compensation signal generation circuit configured to detect a swing width variation of the first to fourth output signals, and generate the compensation signal for correcting a swing width of the first to fourth output signals to conform to a target value, depending on a detected swing width.

In an embodiment, a buffer circuit may include a first current mode circuit configured to generate first and second output signals by converting a current path depending on a first input signal and a second input signal among a plurality of input signals having different phases, and configured to correct a swing width of the first and second output signals by adjusting a first current amount depending on levels of a first compensation signal and a second compensation signal. The buffer circuit may also include a second current mode circuit configured to generate third and fourth output signals by converting a current path depending on a third input signal and a fourth input signal among the plurality of input signals, and configured to correct a swing width of the third and fourth output signals by adjusting a second current amount depending on levels of the first compensation signal and a third compensation signal. The buffer circuit may further include a first compensation signal generation circuit configured to detect a swing width variation of the first to fourth output signals, and configured to generate the first compensation signal for correcting a swing width of the first to fourth output signals to conform to a target value, depending on a detected swing width. The buffer circuit may additionally include a second compensation signal generation circuit configured to detect a swing width variation of the first and second output signals, and configured to generate the second compensation signal for correcting a difference in swing widths of the first and second output signals and the third and fourth output signals, depending a detected swing width. The buffer circuit may also include a third compensation signal generation circuit configured to detect a swing width variation of the third and fourth output signals, and configured to generate the third compensation signal for correcting a difference in swing widths of the third and fourth output signals and the first and second output signals, depending on a detected swing width.

DETAILED DESCRIPTION

Hereinafter, a buffer circuit of a semiconductor apparatus is described with reference to the accompanying drawings through various example embodiments.

Figure 1:
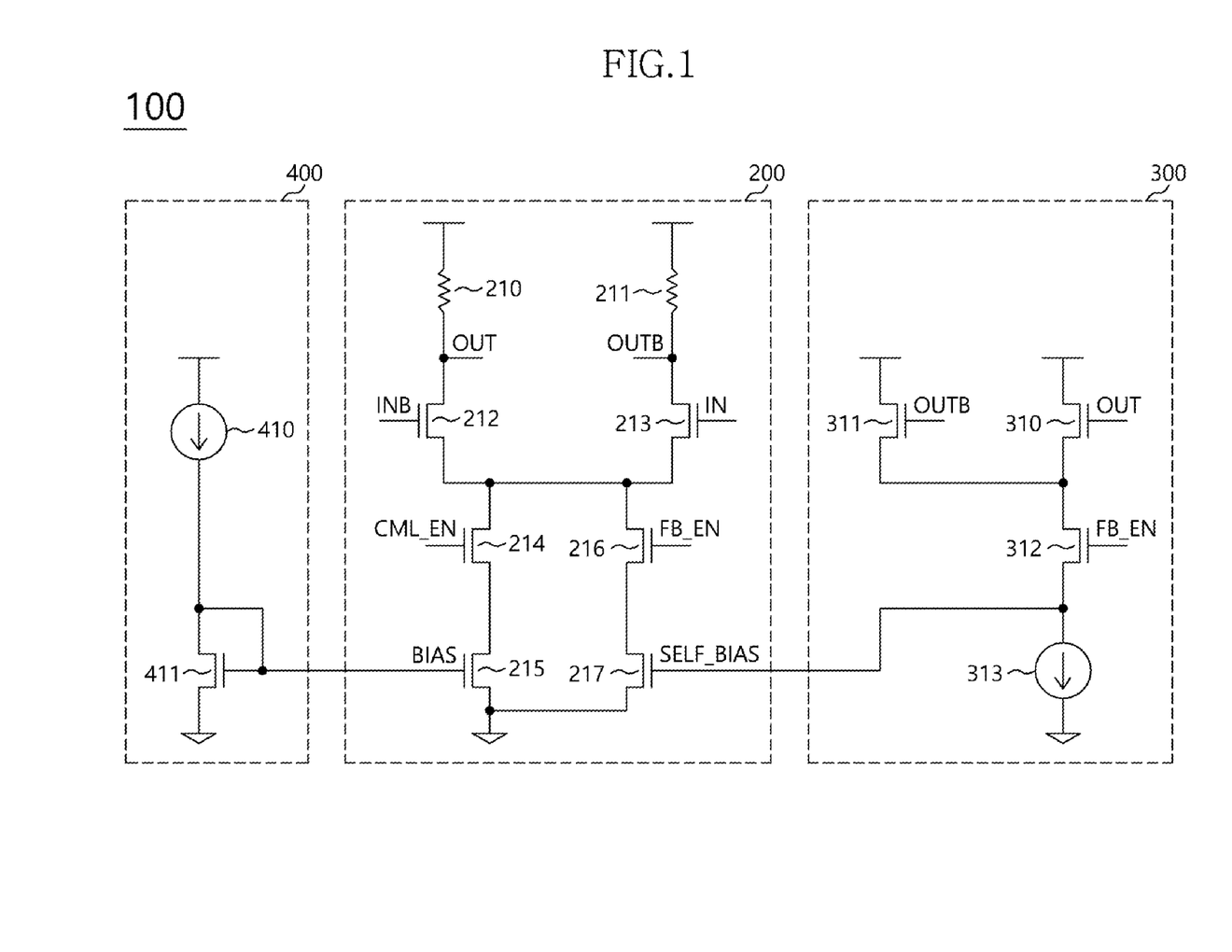
FIG. 1 is a diagram illustrating a configuration of a buffer circuit, in accordance with an embodiment.

FIG. 1 is a diagram illustrating a configuration of a buffer circuit 100, in accordance with an embodiment.

Referring to FIG. 1, the buffer circuit 100 is shown to include a current mode circuit 200 and a compensation signal generation circuit 300.

The buffer circuit 100 may further include a bias generation circuit 400 which generates a bias BIAS for a basic current sink operation of the current mode circuit 200.

The current mode circuit 200 may generate output signals OUT and OUTB by converting a current path depending on input signals IN and INB, and may correct the swing width of the output signals OUT and OUTB by adjusting a current amount depending on the level of a compensation signal SELF_BIAS. Correcting a swing width means to adjust the swing width to conform to a target parameter.

The current mode circuit 200 may include a first resistor 210, a second resistor 211, a first transistor 212, a second transistor 213, a first current sink 214 and 215, and a second current sink 216 and 217.

The first resistor 210 may be coupled with a power supply terminal.

The second resistor 211 may be coupled with the power supply terminal in parallel with the first resistor 210.

The first transistor 212 may have a source terminal which is coupled with the first resistor 210 and a gate terminal to which any one of the input signals IN and INB, for example, the input signal INB, is inputted.

Any one of the output signals OUT and OUTB, for example, the output signal OUT, may be outputted from a node to which the first resistor 210 and the source terminal of the first transistor 212 are coupled.

The second transistor 213 may have a source terminal which is coupled with the second resistor 211 and a gate terminal to which the other of the input signals IN and INB, for example, the input signal IN, is inputted.

The other of the output signals OUT and OUTB, for example, the output signal OUTB, may be outputted from a node to which the second resistor 211 and the source terminal of the second transistor 213 are coupled.

The first current sink 214 and 215 may have one end which is coupled in common with the drain terminal of the first transistor 212 and the drain terminal of the second transistor 213 and the other end which is coupled to a ground terminal.

The first current sink 214 and 215 may include a third transistor 214 and a fourth transistor 215.

The third transistor 214 may have a source terminal which is coupled in common with the drain terminal of the first transistor 212 and the drain terminal of the second transistor 213 and a gate terminal which receives a first enable signal CML_EN.

The fourth transistor 215 may have a source terminal which is coupled with the drain terminal of the third transistor 214 and a gate terminal which receives the bias BIAS.

The second current sink 216 and 217 may have one end which is coupled in common with the drain terminal of the first transistor 212 and the drain terminal of the second transistor 213 in parallel with the first current sink 214 and 215 and the other end which is coupled to the ground terminal.

The second current sink 216 and 217 may include a fifth transistor 216 and a sixth transistor 217.

The fifth transistor 216 may have a source terminal which is coupled in common with the drain terminal of the first transistor 212 and the drain terminal of the second transistor 213 and a gate terminal which receives a second enable signal FB_EN.

The sixth transistor 217 may have a source terminal which is coupled with the drain terminal of the fifth transistor 216 and a gate terminal which receives the compensation signal SELF_BIAS.

The second current sink 216 and 217 may correct the swing width of the output signals OUT and OUTB by adjusting a current amount depending on the level of the compensation signal SELF_BIAS.

The compensation signal generation circuit 300 may perform an operation of detecting a swing width variation of the output signal of the current mode circuit 200 and generating the compensation signal SELF_BIAS for correcting the swing width of the output signal of the current mode circuit 200 to conform to a target value, depending on a detected swing width.

The compensation signal generation circuit 300 may include first to third transistors 310 to 312 and a current source 313.

The first transistor 310 may have a source terminal which is coupled with the power supply terminal and a gate terminal which receives any one of the output signals OUT and OUTB of the current mode circuit 200, for example, the output signal OUT.

The second transistor 311 may have a source terminal which is coupled with the power supply terminal and a gate terminal which receives the other of the output signals OUT and OUTB of the current mode circuit 200, for example, the output signal OUTB.

The third transistor 312 may have a source terminal which is coupled in common with the drain terminal of the first transistor 310 and the drain terminal of the second transistor 311 and a gate terminal which receives the second enable signal FB_EN.

The current source 313 may be coupled between the drain terminal of the third transistor 312 and the ground terminal.

The current source 313 may be a static current source which is configured to allow a constant amount of current to flow regardless of a change in external operating environment.

The voltage level of a node to which the third transistor 312 and the current source 313 are coupled may be outputted as the compensation signal SELF_BIAS.

The operation of the compensation signal generation circuit 300 configured as indicated above is described below.

Because the second enable signal FB_EN has a fixed level (for example, the level of a power supply voltage applied to the power supply terminal), the resistance value of the third transistor 312 may be maintained at a fixed value, and because the current source 313 also has a constant current amount, the resistance value thereof may be constant as well.

As the swing width of the output signal of the current mode circuit 200 increases/decreases, that is, as the average value of the DC levels of the output signals OUT and OUTB of the current mode circuit 200 increases/decreases, the resistance value of the first and second transistors 310 and 311 decreases/increases.

As the resistance value of the first and second transistors 310 and 311 decreases/increases, a swing width variation of the output signal of the current mode circuit 200 may be detected.

In other words, because the resistance value of the current source 313 is constant but the resistance value of the first and second transistors 310 and 311 decreases/increases, the voltage level of the compensation signal SELF_BIAS increases/decreases by the resistance distribution rule.

Therefore, the compensation signal generation circuit 300 may decrease the voltage level of the compensation signal SELF_BIAS when the swing width of the output signal of the current mode circuit 200 increases, and may increase the voltage level of the compensation signal SELF_BIAS when the swing width of the output signal of the current mode circuit 200 decreases.

The bias generation circuit 400 may generate the bias BIAS at a constant level.

The bias generation circuit 400 may include a current source 410 and a transistor 411.

The current source 410 may be coupled with the power supply terminal.

The transistor 411 may have a source terminal which is coupled with the current source 410, a drain terminal which is coupled with the ground terminal, and a gate terminal which is coupled with the source terminal.

The voltage level of a node to which the current source 410 and the transistor 411 are coupled may be outputted as the bias BIAS.

The first enable signal CML_EN and the second enable signal FB_EN used in the current mode circuit 200 of FIG. 1 may be generated by a component in a semiconductor apparatus in which the buffer circuit 100 is included, for example, an enable signal generation circuit. This is described with reference to FIG. 2.

Figure 2:
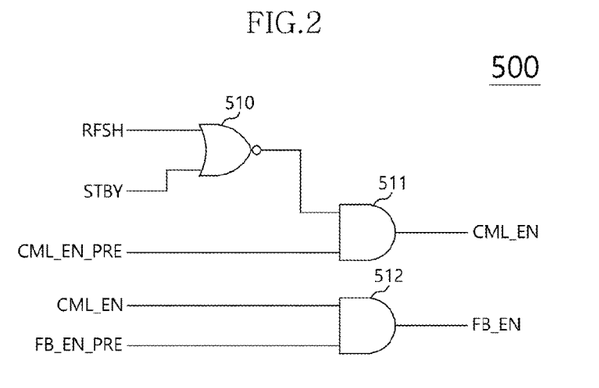
FIG. 2 is a diagram illustrating a configuration of an enable signal generation circuit according to FIG. 1.

FIG. 2 is a diagram illustrating a configuration of an enable signal generation circuit 500 according to FIG. 1.

Referring to FIG. 2, the enable signal generation circuit 500 may activate the buffer circuit 100 in an active operation of a semiconductor apparatus in which the buffer circuit 100 in accordance with the embodiment is included. The enable signal generation circuit 500 may deactivate the buffer circuit 100 in a standby mode and a refresh operation of the semiconductor apparatus. The enable signal generation circuit 500 may generate the first enable signal CML_EN and the second enable signal FB_EN for setting whether to perform a swing width automatic compensation operation.

The enable signal generation circuit 500 may include a plurality of logic gates 510 to 512.

The first logic gate 510 may NOR a refresh signal RFSH and a standby mode signal STBY and output an output signal.

The refresh signal RFSH may be at a high level in a refresh operation, for example, a self refresh operation, of the semiconductor apparatus.

The standby mode signal STBY may be at a high level in a standby mode of the semiconductor apparatus, for example, during the power-down of the semiconductor apparatus.

The second logic gate 511 may output a result value of ANDing the output signal of the first logic gate 510 and a pre-first enable signal CML_EN_PRE, as the first enable signal CML_EN.

The pre-first enable signal CML_EN_PRE may be at a high level after the power-up of the semiconductor apparatus.

The first enable signal CML_EN may be at a low level during the standby mode and the refresh operation period of the semiconductor apparatus, and may be at a high level during the other operation periods (for example, active, read and write operation periods).

The third logic gate 512 may output a result value of ANDing the first enable signal CML_EN and a pre-second enable signal FB_EN_PRE, as the second enable signal FB_EN.

The pre-second enable signal FB_EN_PRE is a signal for setting whether to perform a swing width automatic compensation operation, that is, a signal for setting the activation of the compensation signal generation circuit 300, may be set to a high level or a low level by using a mode register set (or a fuse set).

Figure 3:
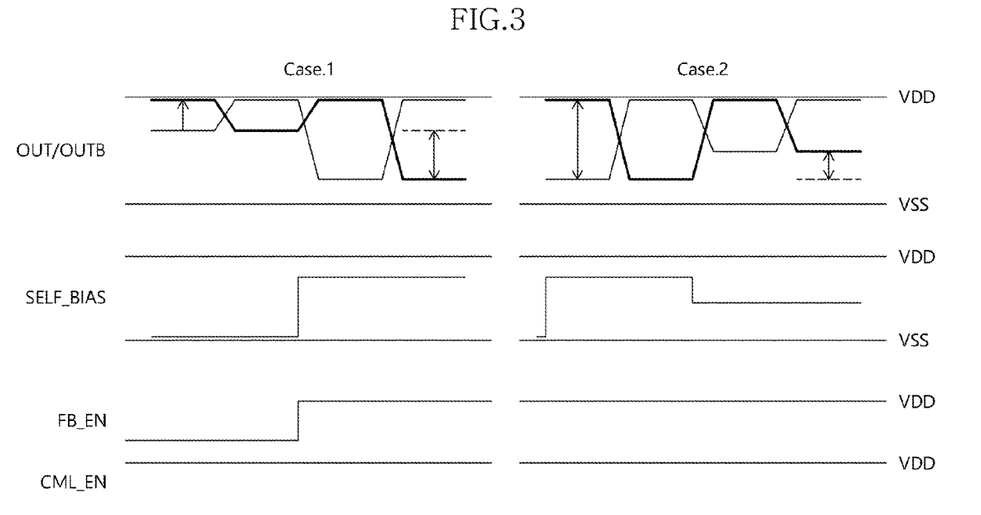
FIG. 3 is a diagram to assist in the explanation of operation examples of a buffer circuit, in accordance with the embodiment.

FIG. 3 is a diagram to assist in the explanation of an operation of the buffer circuit, in accordance with the embodiment. VDD, for example, represents a power supply voltage, while VSS represents a lower ground or reference voltage.

Referring to FIG. 3, in the case where the swing width of the output signals OUT and OUTB of the current mode circuit 200 is smaller than the target value (Case 1), the compensation signal generation circuit 300 operates depending on the second enable signal FB_EN and increases the voltage level of the compensation signal SELF_BIAS.

As the voltage level of the compensation signal SELF_BIAS increases, the swing width of the output signals OUT and OUTB may be increased by the second current sink 216 and 217 of the current mode circuit 200 to be substantially the same as the target value.

On the other hand, in the case where the swing width of the output signals OUT and OUTB of the current mode circuit 200 is larger than the target value (Case 2), the compensation signal generation circuit 300 operates depending on the second enable signal FB_EN and decreases the voltage level of the compensation signal SELF_BIAS.

As the voltage level of the compensation signal SELF_BIAS decreases, the swing width of the output signals OUT and OUTB may be decreased by the second current sink 216 and 217 of the current mode circuit 200 to be substantially the same as the target value.

Figure 4:
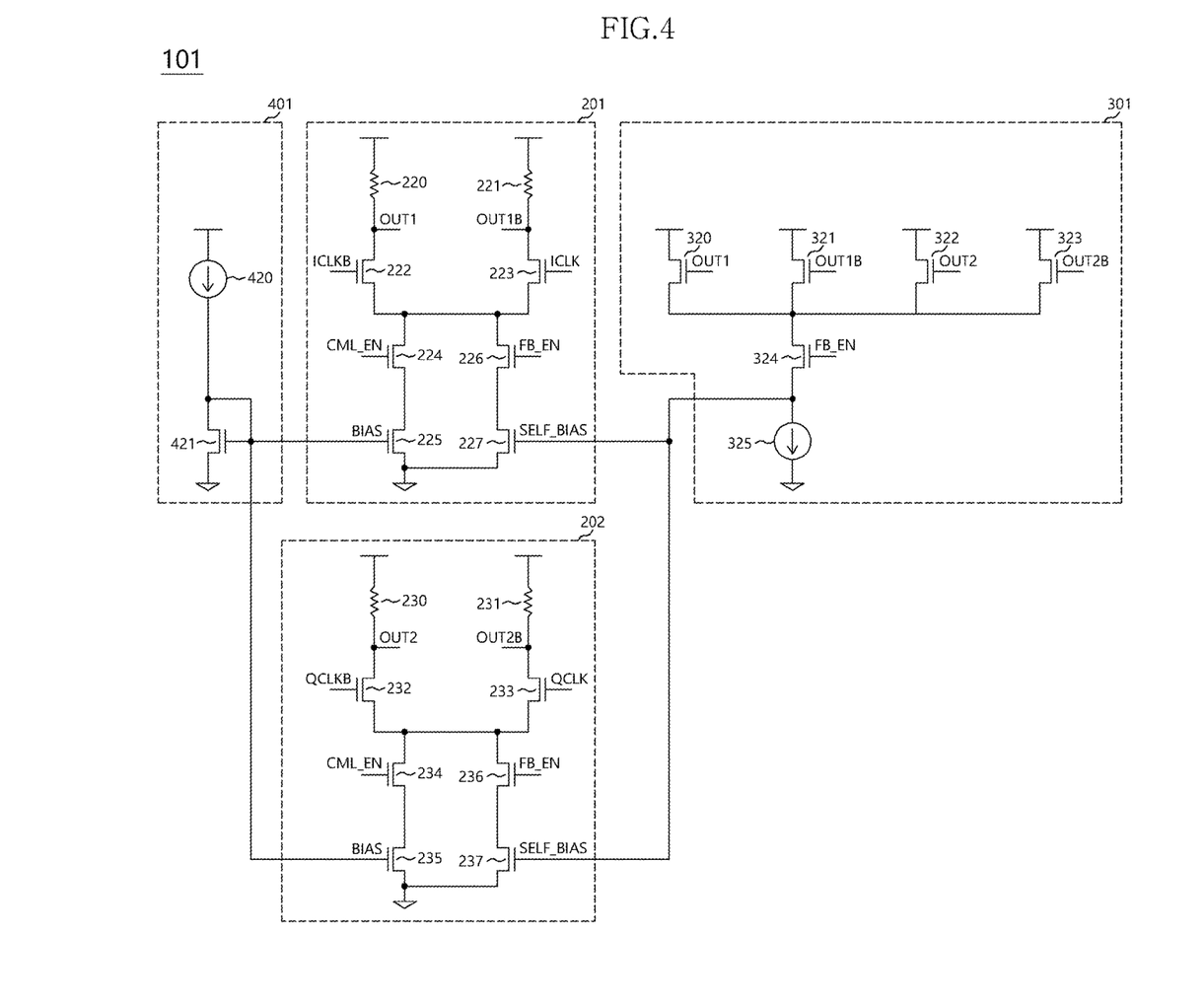
FIG. 4 is a diagram illustrating a configuration of a buffer circuit, in accordance with another embodiment.

FIG. 4 is a diagram illustrating a configuration of a buffer circuit 101, in accordance with another embodiment.

Referring to FIG. 4, the buffer circuit 101 is configured to perform a swing width automatic compensation operation for output signals OUT1, OUT1B, OUT2, and OUT2B in the case where input signals ICLK, ICLKB, QCLK, and QCLKB have different phases.

The buffer circuit 101 may be configured to separately perform a swing width automatic compensation operation (hereinafter, referred to as a compensation operation A) for first and second output signals OUT1 and OUT1B depending on first and second input signals ICLK and ICLKB and a swing width automatic compensation operation (hereinafter, referred to as a compensation operation B) for third and fourth output signals OUT2 and OUT2B depending on third and fourth input signals QCLK and QCLKB.

The buffer circuit 101 may include a first current mode circuit 201, a second current mode circuit 202, and a compensation signal generation circuit 301.

The buffer circuit 101 may further include a bias generation circuit 401 which generates a bias BIAS for basic current sink operations of the first current mode circuit 201 and the second current mode circuit 202.

The first current mode circuit 201 may generate the first and second output signals OUT1 and OUT1B by converting a current path depending on the first and second input signals ICLK and ICLKB, and may correct the swing width of the first and second output signals OUT1 and OUT1B by adjusting a current amount depending on the level of a compensation signal SELF_BIAS.

The first current mode circuit 201 may include a first resistor 220, a second resistor 221, a first transistor 222, second transistor 223, a first current sink 224 and 225, and a second current sink 226 and 227.

Because the first current mode circuit 201 may be configured in the same manner as the current mode circuit 200 of FIG. 1 and performs the compensation operation A in the same manner as the current mode circuit 200 of FIG. 1 performs the compensation operation as described with reference to FIG. 3, descriptions for the configuration and operation of the first current mode circuit 201 are not repeated here.

The second current mode circuit 202 may generate the third and fourth output signals OUT2 and OUT2B by converting a current path depending on the third and fourth input signals QCLK and QCLKB, and may correct the swing width of the third and fourth output signals OUT2 and OUT2B by adjusting a current amount depending on the level of the compensation signal SELF_BIAS.

The second current mode circuit 202 may include a first resistor 230, a second resistor 231, a first transistor 232, a second transistor 233, a first current sink 234 and 235, and a second current sink 236 and 237.

Because the second current mode circuit 202 may be configured in the same manner as the current mode circuit 200 of FIG. 1 and performs the compensation operation B in the same manner as the current mode circuit 200 of FIG. 1 performs the compensation operation as described above with reference to FIG. 3, descriptions for the configuration and operation of the second current mode circuit 202 are not repeated here.

The compensation signal generation circuit 301 may perform an operation of detecting a swing width variation of the output signals of the first current mode circuit 201 and the second current mode circuit 202 and generating the compensation signal SELF_BIAS for correcting the swing width of the output signals of the first current mode circuit 201 and the second current mode circuit 202 to conform to a target value, depending on a detected swing width.

The compensation signal generation circuit 301 may include first to fifth transistors 320 to 324 and a current source 325.

The first transistor 320 may have a source terminal which is coupled with a power supply terminal and a gate terminal which receives any one of the output signals OUT1, OUT1B, OUT2, and OUT2B, for example, the output signal OUT1.

The second transistor 321 may have a source terminal which is coupled with the power supply terminal and a gate terminal which receives another one of the output signals OUT1, OUT1B, OUT2 and OUT2B, for example, the output signal OUT1B.

The third transistor 322 may have a source terminal which is coupled with the power supply terminal and a gate terminal which receives still another one of the output signals OUT1, OUT1B, OUT2 and OUT2B, for example, the output signal OUT2.

The fourth transistor 323 may have a source terminal which is coupled with the power supply terminal and a gate terminal which receives the remaining one of the output signals OUT1, OUT1B, OUT2 and OUT2B, for example, the output signal OUT2B.

The fifth transistor 324 may have a source terminal which is coupled in common with the drain terminals of the first to fourth transistors 320 to 323 and a gate terminal which receives a second enable signal FB_EN.

The current source 325 may be coupled between the drain terminal of the fifth transistor 324 and a ground terminal.

The current source 325 may be a static current source which is configured to allow a constant amount of current to flow regardless of a change in external operating environment.

The voltage level of a node to which the fifth transistor 324 and the current source 325 are coupled may be outputted as the compensation signal SELF_BIAS.

The operation of the compensation signal generation circuit 301 configured as indicated above is described below.

Because the second enable signal FB_EN has a fixed level (for example, the level of a power supply voltage applied to the power supply terminal), the resistance value of the fifth transistor 324 may be maintained at a fixed value, and because the current source 325 also has a constant current amount, the resistance value thereof may be constant as well.

As the swing width of the first to fourth output signals OUT1, OUT1B, OUT2, and OUT2B increases/decreases, that is, as the average value of the DC levels of the first to fourth output signals OUT1, OUT1B, OUT2, and OUT2B increases/decreases, the resistance value of the first to fourth transistors 320 to 323 decreases/increases.

As the resistance value of the first to fourth transistors 320 to 323 decreases/increases, a swing width variation of the first to fourth output signals OUT1, OUT1B, OUT2, and OUT2B may be detected.

In other words, because the resistance value of the current source 325 is constant but the resistance value of the first to fourth transistors 320 to 323 decreases/increases, the voltage level of the compensation signal SELF_BIAS increases/decreases by the resistance distribution rule.

Therefore, the compensation signal generation circuit 301 may decrease the voltage level of the compensation signal SELF_BIAS when the swing width of the first to fourth output signals OUT1, OUT1B, OUT2, and OUT2B increases, and may increase the voltage level of the compensation signal SELF_BIAS when the swing width of the first to fourth output signals OUT1, OUT1B, OUT2, and OUT2B decreases.

The bias generation circuit 401 may generate the bias BIAS at a constant level.

The bias generation circuit 401 may include a current source 420 and a transistor 421.

The bias generation circuit 401 may be configured in the same manner as the bias generation circuit 400 of FIG. 1.

Figure 5:
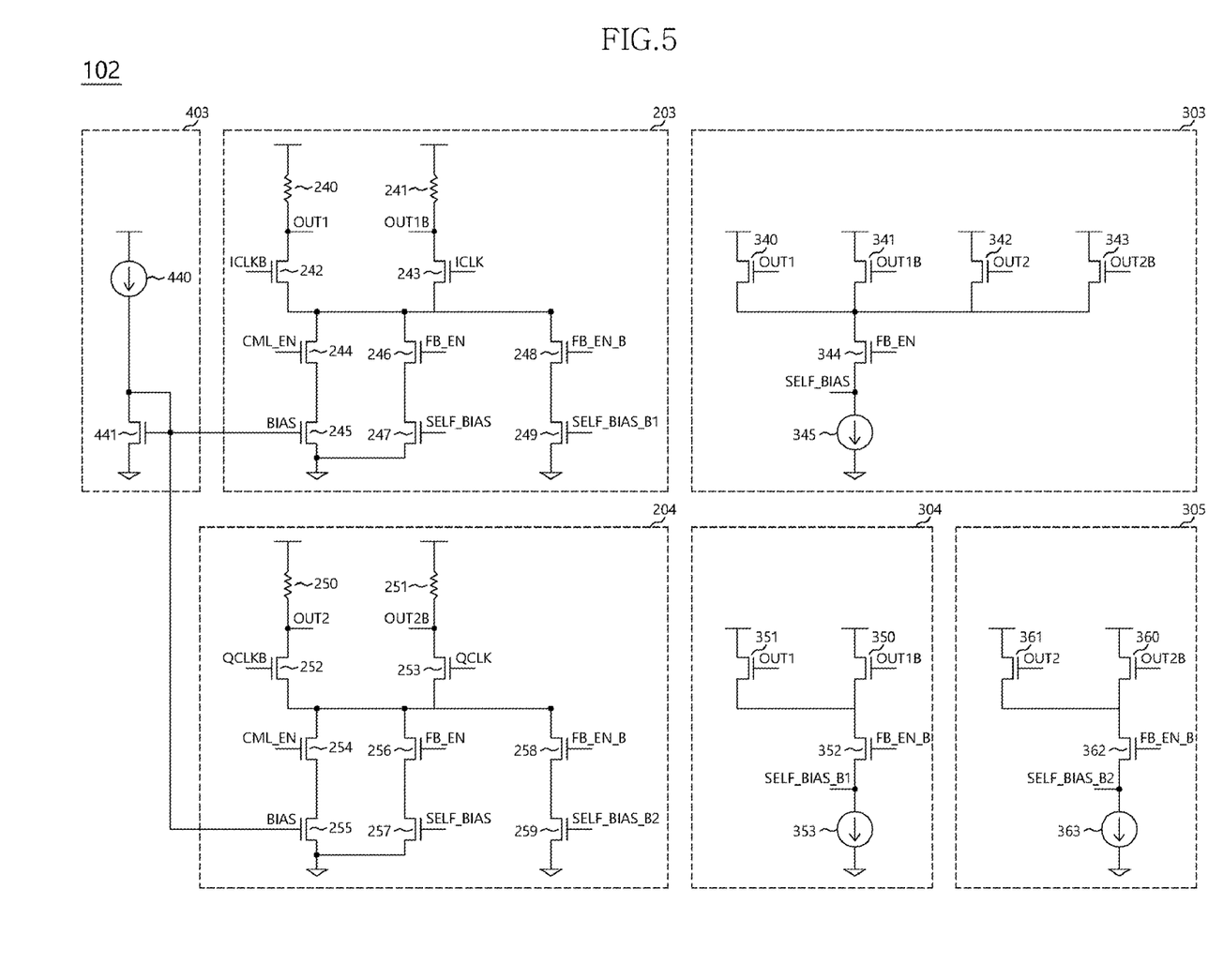
FIG. 5 is a diagram illustrating a configuration of a buffer circuit, in accordance with still another embodiment.

FIG. 5 is a diagram illustrating a configuration of a buffer circuit 102, in accordance with still another embodiment.

Referring to FIG. 5, the buffer circuit 102 may adopt the buffer circuit 101 of FIG. 4 as a basic structure, and may be configured to additionally compensate for a swing width variation difference due to a mismatch in the designs of a first current mode circuit 203 and a second current mode circuit 204 of the buffer circuit 101.

Referring to FIG. 5, the buffer circuit 102 may include the first current mode circuit 203, the second current mode circuit 204, and a plurality of compensation signal generation circuits, for example, first to third compensation signal generation circuits 303 to 305.

The buffer circuit 102 may further include a bias generation circuit 403, which generates a bias BIAS for basic current sink operations of the first current mode circuit 203 and the second current mode circuit 204.

The first current mode circuit 203 may generate first and second output signals OUT1 and OUT1B by converting a current path depending on first and second input signals ICLK and ICLKB, and may correct the swing width of the first and second output signals OUT1 and OUT1B by adjusting a current amount depending on the level of a first compensation signal SELF_BIAS.

The first current mode circuit 203 may additionally compensate for a swing width variation difference due to a mismatch of the first current mode circuit 203 and the second current mode circuit 204 by correcting a current amount depending on the level of a second compensation signal SELF_BIAS_B1, which is generated by detecting the swing width of the first and second output signals OUT1 and OUT1B.

The first current mode circuit 203 may include a first resistor 240, a second resistor 241, a first transistor 242, a second transistor 243, a first current sink 244 and 245, a second current sink 246 and 247, and a third current sink 248 and 249.

Because the first current mode circuit 203 may be configured in the same manner as the current mode circuit 200 of FIG. 1 and operates in the same manner as the current mode circuit 200 of FIG. 1 operates as described above with reference to FIG. 3, except the third current sink 248 and 249, descriptions for the configuration and operation of the first current mode circuit 203 are not repeated here.

The third current sink 248 and 249 may be coupled between the second transistor 243 and a ground terminal in parallel with the second current sink 246 and 247.

The third current sink 248 and 249 may include a seventh transistor 248 and an eighth transistor 249.

The seventh transistor 248 may have a source terminal which is coupled in common with the drain terminal of the first transistor 242 and the drain terminal of the second transistor 243 and a gate terminal which receives a third enable signal FB_EN_B.

The eighth transistor 249 may have a source terminal which is coupled with the drain terminal of the seventh transistor 248 and a gate terminal which receives the second compensation signal SELF_BIAS_B1.

The third current sink 248 and 249 may correct the swing width of the first and second output signals OUT1 and OUT1B by additionally adjusting a current amount depending on the level of the second compensation signal SELF_BIAS_B1.

The second current sink 246 and 247 may perform a swing width compensation operation for the first and second output signals OUT1 and OUT1B, but might not compensate for a swing width variation difference due to a mismatch in the designs of the first current mode circuit 203 and the second current mode circuit 204.

Therefore, by the operation of the third current sink 248 and 249, a difference between the swing width of the first and second output signals OUT1 and OUT1B and the swing width of the third and fourth output signals OUT2 and OUT2B due to a mismatch of the second current mode circuit 204 and the first current mode circuit 203 may be compensated for.

The second current mode circuit 204 may generate the third and fourth output signals OUT2 and OUT2B by converting a current path depending on the third and fourth input signals QCLK and QCLKB, and may correct the swing width of the third and fourth output signals OUT2 and OUT2B by adjusting a current amount depending on the level of the first compensation signal SELF_BIAS.

The second current mode circuit 204 may additionally compensate for a swing width variation difference due to a mismatch of the first current mode circuit 203 and the second current mode circuit 204 by correcting a current amount depending on the level of a third compensation signal SELF_BIAS_B2 which is generated by detecting the swing width of the third and fourth output signals OUT2 and OUT2B.

The second current mode circuit 204 may include a first resistor 250, a second resistor 251, a first transistor 252, a second transistor 253, a first current sink 254 and 255, a second current sink 256 and 257, and a third current sink 258 and 259.

Because the second current mode circuit 204 may be configured in the same manner as the current mode circuit 200 of FIG. 1 and operates in the same manner as the current mode circuit 200 of FIG. 1 operates as described above with reference to FIG. 3, except the third current sink 258 and 259, descriptions for the configuration and operation of the second current mode circuit 204 are not repeated here.

The third current sink 258 and 259 may be coupled between the second transistor 253 and the ground terminal in parallel with the second current sink 256 and 257.

The third current sink 258 and 259 may include a seventh transistor 258 and an eighth transistor 259.

The seventh transistor 258 may have a source terminal which is coupled in common with the drain terminal of the first transistor 252 and the drain terminal of the second transistor 253 and a gate terminal which receives the third enable signal FB_EN_B.

The eighth transistor 259 may have a source terminal which is coupled with the drain terminal of the seventh transistor 258 and a gate terminal which receives the third compensation signal SELF_BIAS_B2.

The third current sink 258 and 259 may correct the swing width of the third and fourth output signals OUT2 and OUT2B by additionally adjusting a current amount depending on the level of the third compensation signal SELF_BIAS_B2.

The second current sink 256 and 257 may perform a swing width compensation operation for the third and fourth output signals OUT2 and OUT2B, but might not compensate for a swing width variation difference due to a mismatch in the designs of the first current mode circuit 203 and the second current mode circuit 204.

Therefore, by the operation of the third current sink 258 and 259, a difference between the swing width of the third and fourth output signals OUT2 and OUT2B and the swing width of the first and second output signals OUT1 and OUT1B due to a mismatch of the second current mode circuit 204 and the first current mode circuit 203 may be compensated for.

The first compensation signal generation circuit 303 may perform an operation of detecting a swing width variation of the output signals of the first current mode circuit 203 and the second current mode circuit 204 and generating the first compensation signal SELF_BIAS for correcting the swing width of the output signals of the first current mode circuit 203 and the second current mode circuit 204 to conform to a target value, depending on a detected swing width.

The first compensation signal generation circuit 303 may include first to fifth transistors 340 to 344 and a current source 345.

The first compensation signal generation circuit 303 may be configured in the same manner as the compensation signal generation circuit 301 of FIG. 4.

The second compensation signal generation circuit 304 may perform an operation of detecting a swing width variation of the first and second output signals OUT1 and OUT1B and generating the second compensation signal SELF_BIAS_B1 for correcting a swing width difference of output signals due to a mismatch of the first current mode circuit 203 and the second current mode circuit 204 depending on a detected swing width.

The second compensation signal generation circuit 304 may include first to third transistors 350 to 352 and a current source 353.

The first transistor 350 may have a source terminal which is coupled with a power supply terminal and a gate terminal which receives any one of the first and second output signals OUT1 and OUT1B, for example, the output signal OUT1B.

The second transistor 351 may have a source terminal which is coupled with the power supply terminal and a gate terminal which receives the other of the first and second output signals OUT1 and OUT1B, for example, the output signal OUT1.

The third transistor 352 may have a source terminal which is coupled in common with the drain terminal of the first transistor 350 and the drain terminal of the second transistor 351 and a gate terminal which receives the third enable signal FB_EN_B.

The current source 353 may be coupled between the drain terminal of the third transistor 352 and the ground terminal.

The current source 353 may be a static current source which is configured to allow a constant amount of current to flow regardless of a change in external operating environment.

The voltage level of a node to which the third transistor 352 and the current source 353 are coupled may be outputted as the second compensation signal SELF_BIAS_B1.

The third compensation signal generation circuit 305 may perform an operation of detecting a swing width variation of the third and fourth output signals OUT2 and OUT2B and generating the third compensation signal SELF_BIAS_B2 for correcting a swing width difference of output signals due to a mismatch of the first current mode circuit 203 and the second current mode circuit 204 depending on a detected swing width.

The third compensation signal generation circuit 305 may include first to third transistors 360 to 362 and a current source 363.

The first transistor 360 may have a source terminal which is coupled with the power supply terminal and a gate terminal which receives any one of the third and fourth output signals OUT2 and OUT2B, for example, the output signal OUT2B.

The second transistor 361 may have a source terminal which is coupled with the power supply terminal and a gate terminal which receives the other of the third and fourth output signals OUT2 and OUT2B, for example, the output signal OUT2.

The third transistor 362 may have a source terminal which is coupled in common with the drain terminal of the first transistor 360 and the drain terminal of the second transistor 361 and a gate terminal which receives the third enable signal FB_EN_B.

The current source 363 may be coupled between the drain terminal of the third transistor 362 and the ground terminal.

The current source 363 may be a static current source which is configured to allow a constant amount of current to flow regardless of a change in external operating environment.

The voltage level of a node to which the third transistor 362 and the current source 363 are coupled may be outputted as the third compensation signal SELF_BIAS_B2.

The buffer circuit 102 in accordance with the embodiment configured as indicated above performs an operation of correcting the swing width of the first to fourth output signals OUT1, OUT1B, OUT2, and OUT2B by the operations of the first compensation signal generation circuit 303, the first current mode circuit 203, and the second current mode circuit 204.

In the case where a mismatch of the second current mode circuit 204 and the first current mode circuit 203 exists, the swing widths of the first to fourth output signals OUT1, OUT1B, OUT2, and OUT2B might not be corrected constantly to the target value, and a difference may exist therebetween.

Therefore, the buffer circuit 102 adjusts in common the swing widths of the first to fourth output signals OUT1, OUT1B, OUT2, and OUT2B by using the first compensation signal SELF_BIAS generated through the first compensation signal generation circuit 303.

The buffer circuit 102 may offset a difference in the swing widths of the first and second output signals OUT1 and OUT1B and the third and fourth output signals OUT2 and OUT2 by additionally adjusting the swing width of the first and second output signals OUT1 and OUT1B by using the second compensation signal SELF_BIAS_B1 generated through the second compensation signal generation circuit 304 and by additionally adjusting the swing width of the third and fourth output signals OUT2 and OUT2B by using the third compensation signal SELF_BIAS_B2 generated through the third compensation signal generation circuit 305.

The bias generation circuit 403 may generate the bias BIAS at a constant level.

The bias generation circuit 403 may include a current source 440 and a transistor 441.

The bias generation circuit 403 may be configured in the same manner as the bias generation circuit 400 of FIG. 1.

Figure 6:
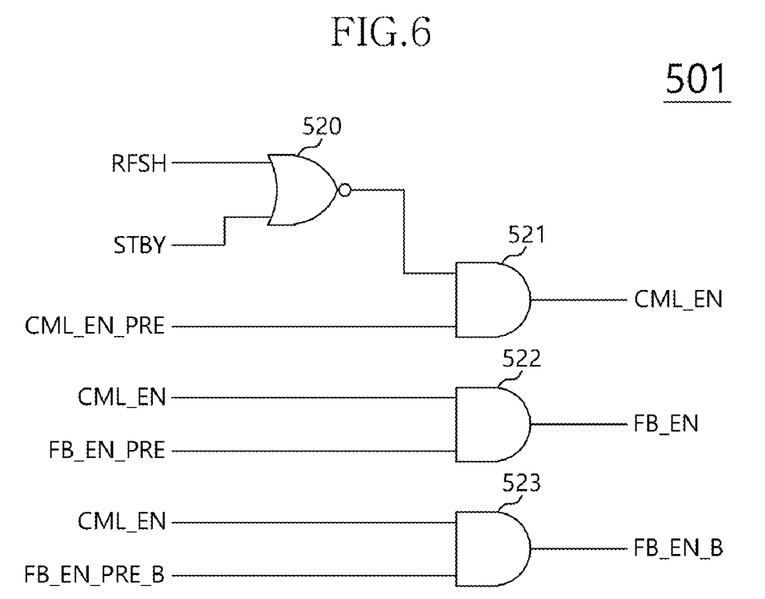
FIG. 6 is a diagram illustrating a configuration of an enable signal generation circuit according to FIG. 5.

FIG. 6 is a diagram illustrating a configuration of an enable signal generation circuit 501 according to FIG. 5.

Referring to FIG. 6, the enable signal generation circuit 501 may activate the buffer circuit 102 in an active operation of a semiconductor apparatus in which the buffer circuit 102 in accordance with the embodiment is included. The enable signal generation circuit 501 may deactivate the buffer circuit 102 in a standby mode and a refresh operation of the semiconductor apparatus. The enable signal generation circuit 501 may generate the first enable signal CML_EN, the second enable signal FB_EN and the third enable signal FB_EN_B for setting whether to perform a swing width automatic compensation operation.

The enable signal generation circuit 501 may include a plurality of logic gates 520 to 523.

The first logic gate 520 may NOR a refresh signal RFSH and a standby mode signal STBY and output an output signal.

The refresh signal RFSH may be at a high level in a refresh operation, for example, a self refresh operation, of the semiconductor apparatus.

The standby mode signal STBY may be at a high level in a standby mode of the semiconductor apparatus, for example, during the power-down of the semiconductor apparatus.

The second logic gate 521 may output a result value of ANDing the output signal of the first logic gate 520 and a pre-first enable signal CML_EN_PRE, as the first enable signal CML_EN.

The pre-first enable signal CML_EN_PRE may be at a high level after the power-up of the semiconductor apparatus.

The first enable signal CML_EN may be at a low level during the standby mode and the refresh operation period of the semiconductor apparatus, and may be at a high level during the other operation periods (for example, active, read and write operation periods).

The third logic gate 522 may output a result value of ANDing the first enable signal CML_EN and a pre-second enable signal FB_EN_PRE, as the second enable signal FB_EN.

The pre-second enable signal FB_EN_PRE as a signal for setting whether to perform a swing width automatic compensation operation, that is, a signal for setting the activation of the first compensation signal generation circuit 303, may be set to a high level or a low level by using a mode register set (or a fuse set).

The fourth logic gate 523 may output a result value of ANDing the first enable signal CML_EN and a pre-third enable signal FB_EN_PRE_B, as the third enable signal FB_EN_B.

The pre-third enable signal FB_EN_PRE_B as a signal for setting the activation of the second and third compensation signal generation circuits 304 and 305 may be set to a high level or a low level by using a mode register set (or a fuse set).

While a limited number of embodiments have been described above, it will be understood by those skilled in the art that the described embodiments serve as examples and that other embodiments are possible. Accordingly, the buffer circuit of a semiconductor apparatus described herein should not be limited based on the described embodiments.

What is claimed is:
1. A buffer circuit comprising:
a current mode circuit configured to:
generate output signals by converting a current path depending on input signals, and
correct a swing width of the output signals by adjusting a current amount depending on a level of a compensation signal; and
a compensation signal generation circuit configured to:
be inputted with the output signals,
detect a swing width variation of the output signals,
generate the compensation signal for correcting a swing width of the output signals to conform to a target value, depending on a detected swing width,
decrease a level of the compensation signal when the swing width increases; and
increase the level of the compensation signal when the swing width decreases.
2. The buffer circuit according to claim 1, wherein the current mode circuit comprises:
a first current sink configured to adjust the current amount depending on a bias signal; and
a second current sink configured to adjust the current amount depending on the compensation signal, wherein the second current sink is coupled in parallel with the first current sink.
3. The buffer circuit according to claim 1, wherein the current mode circuit comprises:
a first resistor coupled with a power supply terminal;
a second resistor coupled with the power supply terminal in parallel with the first resistor;
a first transistor coupled with the first resistor and configured to operate depending on a first input signal of the input signals;
a second transistor coupled with the second resistor and configured to operate depending on a second input signal of the input signals different from the first input signal;
a first current sink, having one end which is coupled in common with the first transistor and the second transistor, configured to adjust the current amount depending on a bias; and
a second current sink, having one end which is coupled in common with the first transistor and the second transistor, configured to adjust the current amount depending on the compensation signal, wherein the second current sink is in parallel with the first current sink.
4. The buffer circuit according to claim 1, wherein the compensation signal generation circuit comprises:
a first transistor coupled with a power supply terminal and configured to operate depending on a first output signal of the output signals;
a second transistor coupled with the power supply terminal and configured to operate depending on a second output signal of the output signals different from the first output signal, wherein the second transistor is coupled in parallel with the first transistor; and
a current source having one end which is coupled in common with the first transistor and the second transistor,
wherein a voltage of a node to which the second transistor and the current source are coupled is outputted as the compensation signal.
5. The buffer circuit according to claim 1, wherein the current mode circuit is further configured to be activated depending on a first enable signal which is activated during an active mode of a semiconductor apparatus.
6. The buffer circuit according to claim 5, wherein the compensation signal generation circuit is further configured to be activated depending on the first enable signal and an option signal.
7. A buffer circuit comprising:
a first current mode circuit configured to:
generate first and second output signals by converting a current path depending on a first input signal and a second input signal among a plurality of input signals having different phases; and
correct a swing width of the first and second output signals by adjusting a first current amount depending on a level of a compensation signal;
a second current mode circuit configured to:
generate third and fourth output signals by converting a current path depending on a third input signal and a fourth input signal among the plurality of input signals; and
correct a swing width of the third and fourth output signals by adjusting a second current amount depending on a level of the compensation signal; and
a compensation signal generation circuit configured to:
detect a swing width variation of the first, second, third, and fourth output signals; and
generate the compensation signal for correcting a swing width of the first, second, third, and fourth output signals to conform to a target value, depending on a detected swing width.
8. The buffer circuit according to claim 7, wherein the first current mode circuit comprises:
a first resistor coupled with a power supply terminal;
a second resistor coupled with the power supply terminal, wherein the second resistor is coupled in parallel with the first resistor;
a first transistor coupled with the first resistor and configured to operate depending on the first input signal;

a second transistor coupled with the second resistor and configured to operate depending on the second input signal;

a first current sink having one end which is coupled in common with the first transistor and the second transistor, wherein the first current sink is configured to adjust the first current amount depending on a bias; and a second current sink having one end which is coupled in common with the first transistor and the second transistor, wherein the second current sink is coupled in parallel with the first current sink, and wherein the second current sink is configured to adjust the first current amount depending on the compensation signal.

9. The buffer circuit according to claim 7, wherein the second current mode circuit comprises:

a first resistor coupled with a power supply terminal;

a second resistor coupled with the power supply terminal, wherein the second resistor is coupled in parallel with the first resistor;

a first transistor coupled with the first resistor and configured to operate depending on the third input signal;

a second transistor coupled with the second resistor and configured to operate depending on the fourth input signal;

a first current sink having one end which is coupled in common with the first transistor and the second transistor, wherein the first current sink is configured to adjust the second current amount depending on a bias; and a second current sink having one end which is coupled in common with the first transistor and the second transistor, wherein the second current sink is coupled in parallel with the first current sink, and wherein the second current sink is configured to adjust the second current amount depending on the compensation signal.

10. The buffer circuit according to claim 7, wherein the compensation signal generation circuit is further configured to:

decrease a level of the compensation signal when the swing width increases; and increase the level of the compensation signal when the swing width decreases.

11. The buffer circuit according to claim 7, wherein the compensation signal generation circuit comprises:

first, second, third, and fourth transistors configured to operate depending on the first, second, third, and fourth output signals, respectively, wherein the first, second, third, and fourth transistors are each coupled to a power supply terminal, and wherein the first, second, third, and fourth transistors are all coupled in parallel with one another; and a current source having one end which is coupled in common with the first transistor, the second transistor, the third transistor, and the fourth transistor, wherein a voltage of a node to which the first transistor, the second transistor, the third transistor, and the fourth transistor and the current source are coupled is outputted as the compensation signal.

12. A buffer circuit comprising:

a first current mode circuit configured to:

generate first and second output signals by converting a current path depending on a first input signal and a second input signal among a plurality of input signals having different phases; and correct a swing width of the first and second output signals by adjusting a first current amount depending on levels of a first compensation signal and a second compensation signal;

a second current mode circuit configured to:

generate third and fourth output signals by converting a current path depending on a third input signal and a fourth input signal among the plurality of input signals; and correct a swing width of the third and fourth output signals by adjusting a second current amount depending on levels of the first compensation signal and a third compensation signal;

a first compensation signal generation circuit configured to:

detect a swing width variation of the first to fourth output signals; and generate the first compensation signal for correcting a swing width of the first to fourth output signals to conform to a target value, depending on a detected swing width;

a second compensation signal generation circuit configured to:

detect a swing width variation of the first and second output signals; and generate the second compensation signal for correcting a difference in swing widths of the first and second output signals and the third and fourth output signals, depending on a detected swing width; and a third compensation signal generation circuit configured to:

detect a swing width variation of the third and fourth output signals; and generate the third compensation signal for correcting a difference in swing widths of the third and fourth output signals and the first and second output signals, depending on a detected swing width.

13. The buffer circuit according to claim 12, wherein the first current mode circuit comprises:

a first resistor coupled with a power supply terminal;

a second resistor coupled with the power supply terminal, wherein the second resistor is coupled in parallel with the first resistor;

a first transistor coupled with the first resistor and configured to operate depending on the first input signal;

a second transistor coupled with the second resistor and configured to operate depending on the second input signal;

a first current sink having one end which is coupled in common with the first transistor and the second transistor, wherein the first current sink is configured to adjust the first current amount depending on a bias;

a second current sink having one end which is coupled in common with the first transistor and the second transistor, wherein the second current sink is coupled in parallel with the first current sink, and wherein the second current sink is configured to adjust the first current amount depending on the first compensation signal; and a third current sink having one end which is coupled in common with the first transistor and the second transistor, wherein the third current sink is coupled in parallel with the second current sink, and wherein the third current sink is configured to adjust the first current amount depending on the second compensation signal.

14. The buffer circuit according to claim 12, wherein the second current mode circuit comprises:

a first resistor coupled with a power supply terminal;

a second resistor coupled with the power supply terminal, wherein the second resistor is coupled in parallel with the first resistor;

a first transistor coupled with the first resistor and configured to operate depending on the third input signal;

a second transistor coupled with the second resistor and configured to operate depending on the fourth input signal;

a first current sink having one end which is coupled in common with the first transistor and the second transistor, wherein the first current sink is configured to adjust the second current amount depending on a bias;

a second current sink having one end which is coupled in common with the first transistor and the second transistor, wherein the second current sink is coupled in parallel with the first current sink, and wherein the second current sink is configured to adjust the second current amount depending on the first compensation signal; and a third current sink having one end which is coupled in common with the first transistor and the second transistor, wherein the third current sink is coupled in parallel with the second current sink, and wherein the third current sink is configured to adjust the second current amount depending on the third compensation signal.

15. The buffer circuit according to claim 12, wherein the first compensation signal generation circuit is further configured to:

decrease a level of the first compensation signal when the detected swing width increases; and increase the level of the first compensation signal when the detected swing width decreases.

16. The buffer circuit according to claim 12, wherein the first compensation signal generation circuit comprises:

First, second, third, and fourth transistors configured to operate depending on the first, second, third, and fourth output signals, respectively, wherein the first, second, third, and fourth transistors are each coupled to a power supply terminal, and wherein the first, second, third, and fourth transistors are all coupled in parallel with one another; and a current source having one end which is coupled in common with the first transistor, the second transistor, the third transistor, and the fourth transistor, wherein a voltage of a node to which the first transistor, the second transistor, the third transistor, and the fourth transistor and the current source are coupled is outputted as the first compensation signal.

17. The buffer circuit according to claim 12, wherein the second compensation signal generation circuit comprises:

first and second transistors configured to operate depending on the first output signal and the second output signal, respectively, wherein the first and second transistors are each coupled to a power supply terminal, and wherein the first and second transistors are coupled in parallel with one another; and a current source having one end which is coupled in common with the first transistor and the second transistor, wherein a voltage of a node to which the first transistor, the second transistor, and the current source are coupled is outputted as the second compensation signal.

18. The buffer circuit according to claim 12, wherein the third compensation signal generation circuit comprises:

first and second transistors configured to operate depending on the third output signal and the fourth output signal, respectively, wherein the first and second transistors are each coupled to a power supply terminal, and wherein the first and second transistors are coupled in parallel with one another; and a current source having one end which is coupled in common with the first transistor and the second transistor, wherein a voltage of a node to which the first transistor, the second transistor and the current source are coupled is outputted as the third compensation signal.

* * * * *